United States Patent
Wang et al.

(10) Patent No.: US 12,336,387 B2
(45) Date of Patent: Jun. 17, 2025

(54) DISPLAY SUBSTRATE AND DISPLAY APPARATUS

(71) Applicants: Chengdu BOE Optoelectronics Technology Co., Ltd., Sichuan (CN); BOE TECHNOLOGY GROUP CO., LTD., Beijing (CN)

(72) Inventors: Kang Wang, Beijing (CN); Xiaodong Hao, Beijing (CN); Zheng Bao, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 483 days.

(21) Appl. No.: 17/635,749

(22) PCT Filed: Mar. 10, 2021

(86) PCT No.: PCT/CN2021/080011
§ 371 (c)(1),
(2) Date: Feb. 16, 2022

(87) PCT Pub. No.: WO2021/213049
PCT Pub. Date: Oct. 28, 2021

(65) Prior Publication Data
US 2022/0344426 A1  Oct. 27, 2022

(30) Foreign Application Priority Data
Apr. 24, 2020  (CN) .......................... 202020646909.5

(51) Int. Cl.
*H01L 27/32* (2006.01)
*H01L 51/52* (2006.01)
(Continued)

(52) U.S. Cl.
CPC ......... *H10K 59/1213* (2023.02); *H04N 23/57* (2023.01); *H10K 50/865* (2023.02);
(Continued)

(58) Field of Classification Search
CPC ......... H10K 59/00–95; H10K 59/1213; H10K 59/126; H10K 50/865; H10K 50/87;
(Continued)

(56) References Cited

U.S. PATENT DOCUMENTS

2019/0214596 A1  7/2019  Park
2020/0287161 A1*  9/2020  Kim ....................... H10K 50/15
(Continued)

FOREIGN PATENT DOCUMENTS

CN  107946341 A  4/2018
CN  109817678 A  5/2019
(Continued)

OTHER PUBLICATIONS

Intellectual Property India, First Office Action issued Dec. 19, 2022 for application No. IN202227040031.
(Continued)

*Primary Examiner* — Steven B Gauthier
*Assistant Examiner* — Rhys Poniente Sheker
(74) *Attorney, Agent, or Firm* — HOUTTEMAN LAW LLC

(57) ABSTRACT

Disclosed are a display substrate and a display apparatus. The display substrate, includes base, and an organic electroluminescent display layer, a touch layer, a polarizer and a cover plate sequentially stacked on the base. The organic electroluminescent display layer and the touch layer are bonded with a first bonding layer, and the polarizer and the cover plate are bonded with a second bonding layer. The display substrate includes a camera installation area and a display area surrounding the camera installation area. A
(Continued)

camera is installed on a side of the base away from the organic electroluminescent display layer and located in the camera installation area, a light-emitting layer is not provided in an area of the organic electroluminescent display layer corresponding to the camera installation area, and a first opening is provided in an area of the polarizer corresponding to the camera installation area.

12 Claims, 4 Drawing Sheets

(51) Int. Cl.
| | |
|---|---|
| H04N 5/225 | (2006.01) |
| H04N 23/57 | (2023.01) |
| H10K 50/86 | (2023.01) |
| H10K 50/87 | (2023.01) |
| H10K 59/121 | (2023.01) |
| H10K 59/65 | (2023.01) |
| H10K 59/80 | (2023.01) |
| G06F 3/041 | (2006.01) |
| H10D 86/40 | (2025.01) |
| H10D 86/60 | (2025.01) |

(52) U.S. Cl.
CPC ............ *H10K 50/87* (2023.02); *H10K 59/65* (2023.02); *H10K 59/8792* (2023.02); *H10K 59/8794* (2023.02); *G06F 3/0412* (2013.01); *H10D 86/40* (2025.01); *H10D 86/60* (2025.01)

(58) Field of Classification Search
CPC .......... H10K 50/8791; H10K 50/8792; H10K 50/00–88; H10K 71/00–81; H04N 23/57; G06F 3/0412; G06F 3/041; H01L 27/1214
See application file for complete search history.

(56) References Cited

U.S. PATENT DOCUMENTS

| | | | |
|---|---|---|---|
| 2021/0055817 A1* | 2/2021 | Shin | H10K 50/844 |
| 2021/0083227 A1* | 3/2021 | Her | H10K 59/123 |
| 2021/0408444 A1* | 12/2021 | Ouyang | H10K 59/124 |
| 2022/0208897 A1* | 6/2022 | Yue | H10K 59/122 |

FOREIGN PATENT DOCUMENTS

| | | |
|---|---|---|
| CN | 110233167 A | 9/2019 |
| CN | 110491909 A | 11/2019 |
| CN | 110600511 A | 12/2019 |
| CN | 110610970 A | 12/2019 |
| CN | 211743161 U | 10/2020 |
| EP | 3226101 A1 | 10/2017 |

OTHER PUBLICATIONS

European Patent Office, Extended European Search Report, Dec. 2, 2022, Application No. EP21792331.7.

* cited by examiner

DISPLAY SUBSTRATE AND DISPLAY APPARATUS

CROSS-REFERENCE TO RELATED APPLICATIONS

This is a National Phase Application filed under 35 U.S.C. 371 as a national stage of PCT/CN2021/080011, filed on Mar. 10, 2021, an application claiming the priority of Chinese Patent Application No. 202020646909.5, filed on Apr. 24, 2020, the contents of which are incorporated herein in their entirety by reference.

TECHNICAL FIELD

Embodiments of the present disclosure belong to the field of display technology, and specifically relates to a display substrate and a display apparatus.

BACKGROUND

At present, implementing a full screen by means of AMOLED (active-matrix organic light-emitting diode) screen modules has gradually become the mainstream, and providing an opening on the full screen for installing a camera is gradually accepted by more and more customers as a full screen scheme.

SUMMARY

Embodiments of the present disclosure provide a display substrate and a display apparatus.

In a first aspect, an embodiment of the present disclosure provides a display substrate, including a base, and an organic electroluminescent display layer, a touch layer, a polarizer and a cover plate sequentially stacked on the base, where the organic electroluminescent display layer and the touch layer are bonded with a first bonding layer, and the polarizer and the cover plate are bonded with a second bonding layer; the display substrate includes a display area and a camera installation area, the display area surrounds the camera installation area, a camera is configured to be installed on a side of the base away from the organic electroluminescent display layer and located in the camera installation area, a light-emitting layer is at least not provided in an area of the organic electroluminescent display layer corresponding to the camera installation area, and a first opening is provided in an area of the polarizer corresponding to the camera installation area.

In some embodiments, the second bonding layer is filled in the first opening, and a side surface of the second bonding layer away from the polarizer is flat.

In some embodiments, the area of the organic electroluminescent display layer corresponding to the camera installation area is provided with a pixel driving circuit disposed on the base.

In some embodiments, the first bonding layer is in contact with the pixel driving circuit in the camera installation area, and a side surface of the first bonding layer away from the organic electroluminescent display layer is flat.

In some embodiments, the area of the organic electroluminescent display layer corresponding to the camera installation area is provided with one or more insulation layers disposed on the base.

In some embodiments, the first bonding layer is in contact with the insulation layer in the camera installation area, and a side surface of the first bonding layer away from the organic electroluminescent display layer is flat.

In some embodiments, the display substrate further includes an encapsulation layer disposed between the organic electroluminescent display layer and the first bonding layer and configured to encapsulate the organic electroluminescent display layer.

In some embodiments, the cover plate is provided with a light-shielding layer located on a side of the cover plate closer to the polarizer or away from the polarizer, and an orthographic projection of the light-shielding layer on the base covers an edge of the camera installation area.

In some embodiments, the base, the touch layer, and the cover plate are all transparent.

In some embodiments, the first bonding layer and the second bonding layer are both made of a transparent bonding adhesive material.

In a second aspect, an embodiment of the present disclosure provides a display device, including the display substrate mentioned above and a camera disposed on a side of the base away from the organic electroluminescent display layer in the display substrate, and located in the camera installation area.

In some embodiments, the display device further includes a heat dissipation layer disposed on the side of the base away from the organic electroluminescent display layer in the display substrate, where the heat dissipation layer includes a second opening provided in an area corresponding to the camera installation area of the display substrate.

In some embodiments, the display device further includes a third bonding layer and a fixing plate, where the third bonding layer is disposed in the second opening, the fixing plate is disposed on a side of the third bonding layer away from the base, and an orthographic projection of the fixing plate on the base is located in the second opening; and the camera is fixed on the fixing plate and located on a side of the fixing plate away from the display substrate.

In some embodiments, a distance between a side surface of the fixing plate away from the base and the base is equal to a thickness of the heat dissipation layer.

In some embodiments, a distance between a side surface of the fixing plate away from the base and the base is larger than the thickness of the heat dissipation layer.

BRIEF DESCRIPTION OF DRAWINGS

Accompanying drawings are provided for further understanding of the embodiments of the present disclosure and constitute a part of the specification. Hereinafter, these drawings are intended to explain the present disclosure together with the following embodiments, but should not be considered as a limitation to the present disclosure. The above and other features and advantages will become more apparent to those skilled in the art through detailed description of the exemplary embodiments with reference to the accompanying drawings, in which.

DETAIL DESCRIPTION OF EMBODIMENTS

Figure 1:
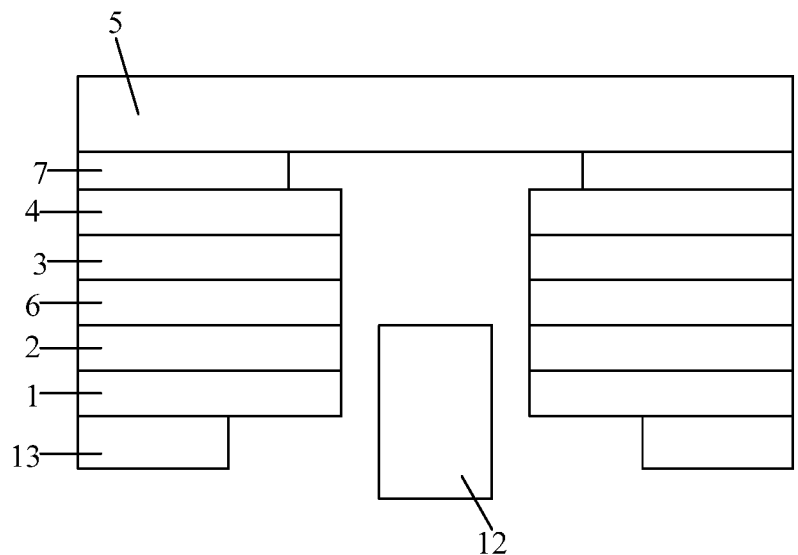
FIG. 1 is a schematic sectional view of a design of an opening in an AMOLED full screen in the related art.

In order to make those skilled in the art better understand the technical solutions in the embodiments of the present disclosure, the display substrate and the display apparatus provided in the embodiments of the present disclosure are described in further detail below with reference to the accompanying drawings and specific embodiments.

Embodiments of the present disclosure will be described more sufficiently below with reference to the accompanying drawings, but which may be embodied in different forms and should not be construed as limited to the embodiments set forth in the disclosure. Rather, these embodiments are provided so that this disclosure will be thorough and complete, and will fully convey the scope of the disclosure to those skilled in the art.

The embodiments of the present disclosure are not limited to the embodiments shown in the drawings, but include modifications of configurations formed based on a manufacturing process. Thus, the areas illustrated in the figures have schematic properties, and the shapes of the areas shown in the figures exemplarily illustrate specific shapes of the areas, but are not intended to be limiting.

FIG. 1 is a schematic diagram of a design of an opening in an AMOLED full screen in the related art. A heat dissipation layer 13, a base 1, an organic electroluminescent display layer 2, a first bonding layer 6, a touch layer 3, a polarizer 4 and a second bonding layer 7 sequentially stacked in the AMOLED full screen, except a cover plate 5 disposed on the second bonding layer 7, are each provided with an opening in a camera installation position, and a camera 12 is installed in the opening. In this design scheme, light leakage may occur due to light scattered and reflected at an edge of the opening in each film layer, thereby seriously influencing the shooting effect of the camera 12. Meanwhile, stress on the camera 12 installed in the openings is uneven, which tends to cause black spots at that position of the display screen during display, and impair the display effect of the display screen.

Figure 2:
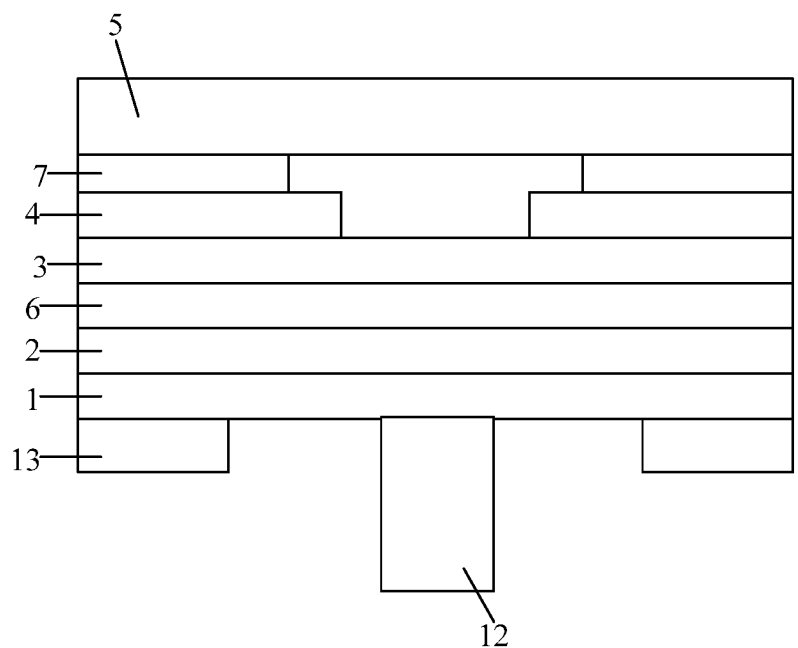
FIG. 2 is a schematic sectional view of another design of an opening in an AMOLED full screen in the related art.

FIG. 2 is a schematic diagram of another design of an opening in an AMOLED full screen in the related art. In this scheme, openings are provided only on the heat dissipation layer 13, the polarizer 4 and the second bonding layer 7 at the camera installation position, and the camera 12 is installed in the opening of the heat dissipation layer 13. In this design scheme, a closed space is formed at the opening positions in the polarizer 4 and the second bonding layer 7, and during high-pressure deaeration in the manufacturing process, a pressure difference between the closed space and the outside may cause poor dents at the camera installation position on the back side of the AMOLED display screen.

Further, in FIG. 2, the camera 12 is installed on the base 1 exposed in the opening of the heat dissipation layer 13. Since the camera 12 is located in the recess, light will be scattered and reflected at the edge of the opening of the heat dissipation layer 13, so that the image captured by the camera 12 may have blurred edges and is not good in the effect. In addition, stress on the camera 12 installed in the recess is uneven, which tends to cause black spots at that position of the display screen during display, and impair the display effect of the display screen.

Aiming at the problems of light leakage caused by the fact that the camera is installed in the openings of a plurality of stacked film layers of an AMOLED full-face screen, and black spots during display in the related art, the present disclosure discloses a display substrate and a display apparatus.

Figure 3:
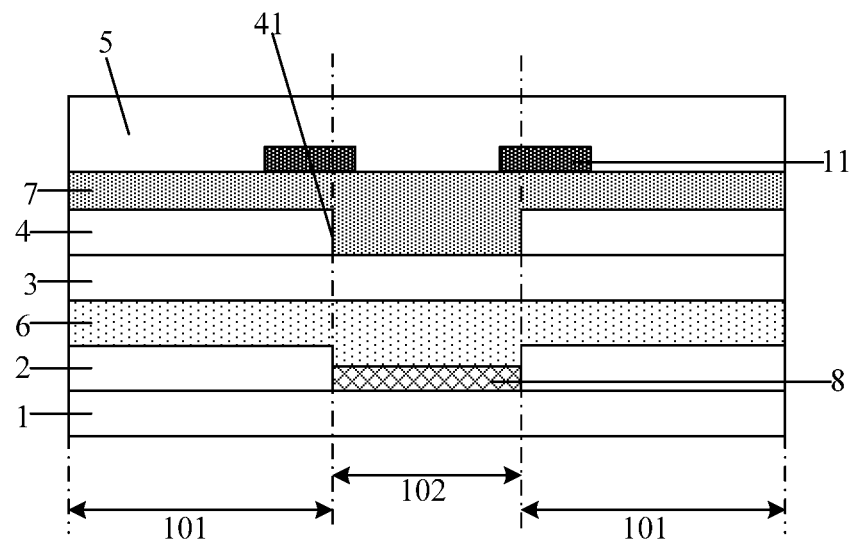
FIG. 3 is a structural sectional view of a display substrate according to the present disclosure.

The present disclosure provides a display substrate which, as shown in FIG. 3, includes a base 1, and an organic electroluminescent display layer 2, a touch layer 3, a polarizer 4 and a cover plate 5 sequentially stacked on the base 1. The organic electroluminescent display layer 2 and the touch layer 3 are bonded with a first bonding layer 6, and the polarizer 4 and the cover plate 5 are bonded with a second bonding layer 7. The display substrate includes a display area 101 and a camera installation area 102. The display area 101 surrounds the camera installation area 102. A camera is configured to be installed on a side of the base 1 away from the organic electroluminescent display layer 2, and located in the camera installation area 102. A light-emitting layer is at least not provided in an area of the organic electroluminescent display layer 2 corresponding to the camera installation area 102, and a first opening 41 is provided in an area of the polarizer 4 corresponding to the camera installation area 102.

The organic electroluminescent display layer 2 includes a pixel driving circuit, an anode, a light-emitting layer and a cathode. The light-emitting layer is sandwiched between the anode and the cathode to form a sandwich structure, the anode is connected to the pixel driving circuit, the cathode is connected to a ground terminal, and the light-emitting layer may emit light under driving of the pixel driving circuit to realize display of the display substrate. The camera installation area 102 is used for installing a camera. In order to ensure that the camera can normally capture images, each film layer in the display substrate is transparent in the area corresponding to the camera installation area 102, and since the light-emitting layer in the organic electroluminescent display layer 2 may emit light under driving, which may affect shooting of the camera, the light-emitting layer is not disposed in the camera installation area 102, and other film layers of the organic electroluminescent display layer 2 may be disposed or not disposed in the camera installation area 102.

Since the light-emitting layer in the organic electroluminescent display layer 2 may emit light during display, it may affect image capture of the camera in the camera installation area 102. The polarizer 4 has a large influence on the light transmittance in the display substrate. Therefore, by opening a first opening 41 in an area of the polarizer 4 corresponding to the camera installation area 102, and not providing the light-emitting layer in at least an area of the organic electroluminescent display layer 2 corresponding to the camera installation area 102, shooting light of the camera in the camera installation area 102 of the display substrate can be successfully transmitted, and the requirements of the camera on light transmittance can be met, and thus the camera can capture images normally. Further, since the opening is provided in only the polarizer 4 in the camera installation area 102 of the display substrate, and the camera is installed on a side of the base 1 away from the organic electroluminescent display layer 2, the camera will not be located in a recessed opening compared with the technology shown in FIG. 1 where each film layer of the display substrate has an opening, thereby avoiding the light scattered and reflected at the edge of the opening and light leakage in the camera installation area 102, and ensuring the shooting effect of the camera. Meanwhile, since the camera is not located in the recessed opening, uneven stress will not occur when the camera is installed in the camera installation area 102, thereby avoiding black spots on the display substrate during display, and ensuring the display effect of the display substrate.

In the present disclosure, the second bonding layer 7 is filled in the first opening 41, and a side surface of the second bonding layer 7 away from the polarizer 4 is flat. With such arrangement, no closed space is formed between the second bonding layer 7 and the cover plate 5 or between the polarizer 4 and the cover plate 5 in the camera installation area 102, and compared with the opening design in the full screen shown in FIG. 2, poor dents in the camera installation area 102 on the back side of the base 1 of the display substrate during the manufacturing process can be avoided. Since the second bonding layer 7 is made of a transparent bonding adhesive material, the second bonding layer 7 filled in the first opening 41 of the polarizer 4 substantially has no effect on transmittance of the shooting light of the camera.

In the present disclosure, the area of the organic electroluminescent display layer 2 corresponding to the camera installation area 102 is provided with a pixel driving circuit 8 disposed on the base 1. In the pixel driving circuit 8, each film layer (such as a gate, a gate insulation layer, a source, a drain, an active layer, or the like of a transistor) is made of a transparent material, so transmittance of the shooting light of the camera is substantially not affected.

The first bonding layer 6 is in contact with the pixel driving circuit 8 in the camera installation area 102, and a side surface of the first bonding layer 6 away from the organic electroluminescent display layer 2 is flat. With such arrangement, no closed space is formed between the first bonding layer 6 and the touch layer 3 or between the pixel driving circuit 8 and the touch layer 3 in the camera installation area 102, and compared with the opening design in the full screen shown in FIG. 2, poor dents in the camera installation area 102 on the back side of the base 1 of the display substrate during the manufacturing process can be avoided. Since the first bonding layer 6 is made of a transparent bonding adhesive material, the first bonding layer 6 substantially has no effect on transmittance of the shooting light of the camera.

Figure 4:
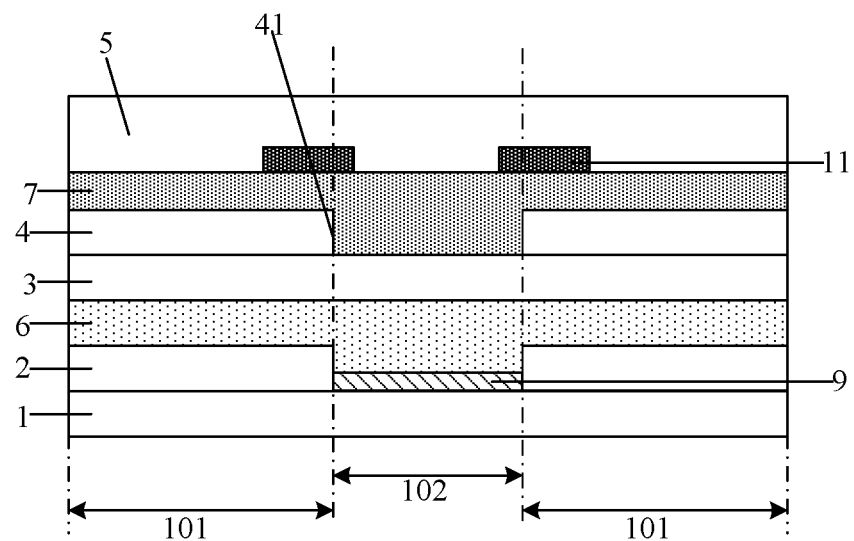
FIG. 4 is a structural sectional view of another display substrate according to the present disclosure.

In the present disclosure, as shown in FIG. 4, the area of the organic electroluminescent display layer 2 corresponding to the camera installation area 102 is provided with one or more insulation layers 9 disposed on the base 1. Each insulation layer 9 is a transparent organic insulation layer or a transparent inorganic insulation layer extending from the display area 101 of the display substrate to the camera installation area 102. Each insulation layer 9 is made of a transparent material, so transmittance of the shooting light of the camera is substantially not affected.

The first bonding layer 6 is in contact with the insulation layer 9 in the camera installation area 102, and a side surface of the first bonding layer 6 away from the organic electroluminescent display layer 2 is flat. With such arrangement, no closed space is formed between the first bonding layer 6 and the touch layer 3 or between the insulation layers 9 and the touch layer 3 in the camera installation area 102, and compared with the opening design in the full screen shown in FIG. 2, poor dents in the camera installation area 102 on the back side of the base 1 of the display substrate during the manufacturing process can be avoided. Since the first bonding layer 6 is made of a transparent bonding adhesive material, the first bonding layer 6 substantially has no effect on transmittance of the shooting light of the camera.

Figure 5:
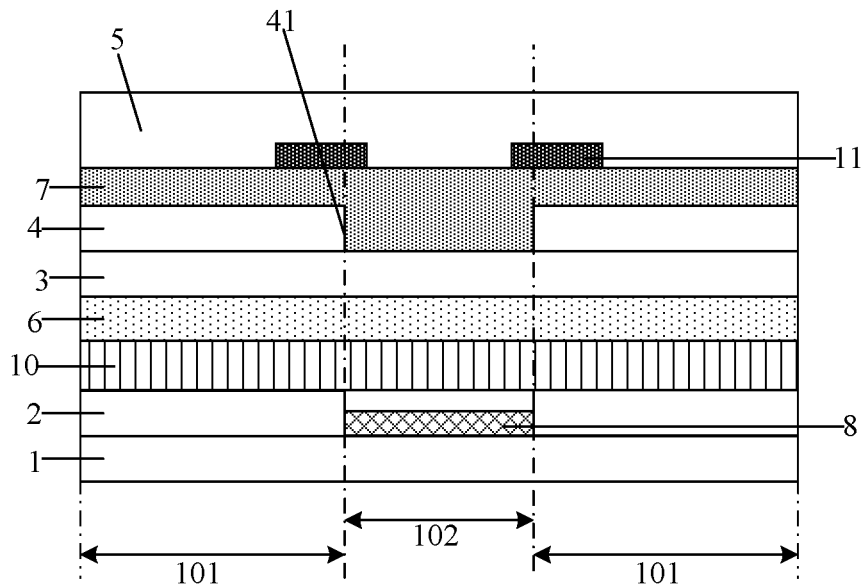
FIG. 5 is a structural sectional view of yet another display substrate according to the present disclosure.

In the present disclosure, as shown in FIG. 5, the display substrate further includes an encapsulation layer 10 disposed between the organic electroluminescent display layer 2 and the first bonding layer 6 and configured to encapsulate the organic electroluminescent display layer 2. The encapsulation layer 10 may be formed by a laminate of a transparent organic film and a transparent inorganic film. In the camera installation area 102, the encapsulation layer 10 substantially has no effect on transmittance of the shooting light of the camera.

In the present disclosure, as shown in FIG. 3, the cover plate 5 is provided with a light-shielding layer 11 disposed on a side of the cover plate 5 closer to the polarizer 4, and an orthographic projection of the light-shielding layer 11 on the base 1 covers an edge of the camera installation area 102. Due to arrangement of the light-shielding layer 11, light leakage at the edge region of the camera installation area 102 can be shielded, so that light leakage will not occur at the edge region of the camera installation area 102, and thus the display effect of the display substrate and the shooting effect of the camera are ensured.

The light-shielding layer 11 is made of a black ink material. It should be noted that the light-shielding layer 11 may also be located on a side of the cover plate 5 away from the polarizer 4.

In the present disclosure, the base 1, the touch layer 3, and the cover plate 5 are all transparent. Therefore, transmittance of the shooting light of the camera will not be affected in the camera installation area 102. The base 1 and the cover plate 5 may both adopt a flexible material to obtain a flexible display substrate.

In the display substrate provided in the above embodiment, by arranging a first opening in an area of the polarizer corresponding to the camera installation area, and not providing the light-emitting layer in at least an area of the organic electroluminescent display layer corresponding to the camera installation area, shooting light of the camera in the camera installation area of the display substrate can be successfully transmitted, and the requirements of the camera on light transmittance can be met, and thus the camera can capture images normally. Furthermore, since the opening is provided in only the polarizer in the camera installation area of the display substrate, and the camera is installed on a side of the base away from the organic electroluminescent display layer, the camera will not be located in a recessed opening compared with the technology where each film layer of the display substrate has an opening, thereby avoiding the light scattered and reflected at the edge of the opening and light leakage in the camera installation area, and ensuring the shooting effect of the camera. Meanwhile, since the camera is not located in the recessed opening, uneven stress will not occur when the camera is installed in the camera installation area, thereby avoiding black spots on the display substrate during display, and ensuring the display effect of the display substrate.

Figure 6:
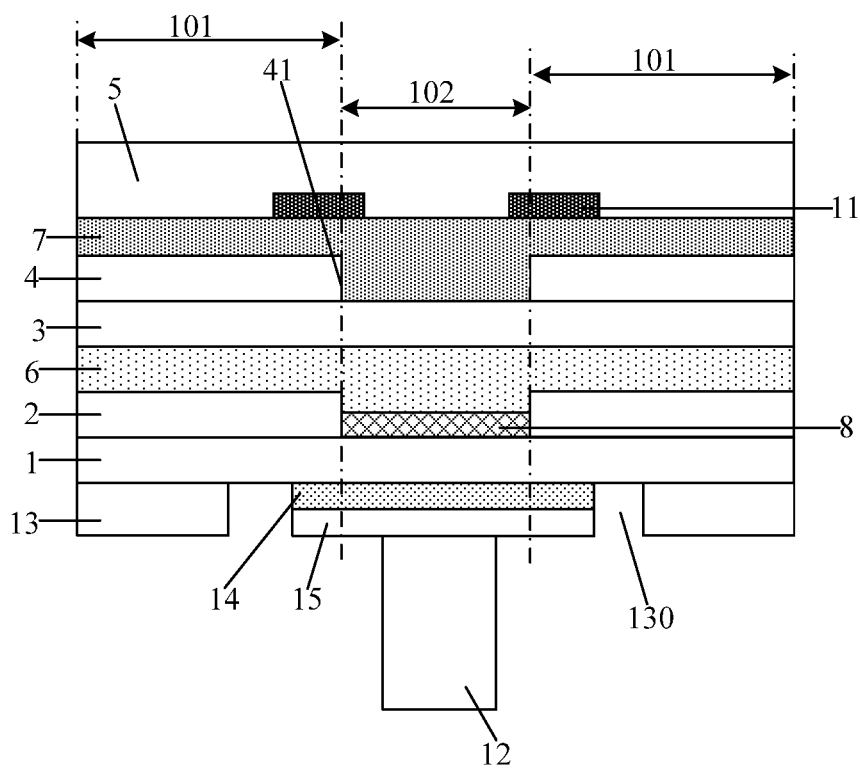
FIG. 6 is a structural sectional view of a display apparatus according to the present disclosure.

The present disclosure further provides a display apparatus which, as shown in FIG. 6, includes a display substrate of any of the above embodiments, and further a camera 12 which is disposed on a side of the base 1 away from the organic electroluminescent display layer 2 in the display substrate, and located in the camera installation area 102.

In the present disclosure, the display device further includes a heat dissipation layer 13 disposed on the side of the base 1 away from the organic electroluminescent display layer 2 in the display substrate. The heat dissipation layer 13 has a second opening 130 provided in an area corresponding to the camera installation area 102 of the display substrate.

The heat dissipation layer 13 is made of a heat dissipation cotton or a metal heat dissipation material, and the second opening 130 provided in the heat dissipation layer 13 can prevent the heat dissipation layer 13 from blocking the shooting light of the camera 12, thereby ensuring normal shooting of the camera 12.

In the present disclosure, the display apparatus further includes a third bonding layer 14 and a fixing plate 15. The third bonding layer 14 is disposed in the second opening 130, the fixing plate 15 is disposed on a side of the third bonding layer 14 away from the base 1, and an orthographic projection of the fixing plate 15 on the base 1 is located in the second opening 130. The camera 12 is fixed on the fixing plate 15 and located on a side of the fixing plate 15 away from the display substrate. The third bonding layer 14 is made of transparent bonding adhesive. The fixing plate 15 is a transparent glass plate. The third bonding layer 14 and the fixing plate 15 provided in such manner substantially have no effect on transmittance of the shooting light of the camera 12, and thus will not affect normal shooting of the camera 12.

In the present disclosure, a distance between a side surface of the fixing plate 15 away from the base 1 and the base 1 is equal to a thickness of the heat dissipation layer 13. With such arrangement, compared with the camera installation position shown in FIG. 2, the camera 12 will not be located in a recessed opening, thereby avoiding the light scattered and reflected at the edge of the opening, as well as blurred edges of the images captured by the camera 12, and thus ensuring the shooting effect of the camera 12. Meanwhile, since the camera 12 is not located in the recessed opening, uneven stress will not occur when the camera 12 is installed in the camera installation area 102, thereby avoiding black spots on the display apparatus during display, and ensuring the display effect of the display apparatus.

Figure 7:
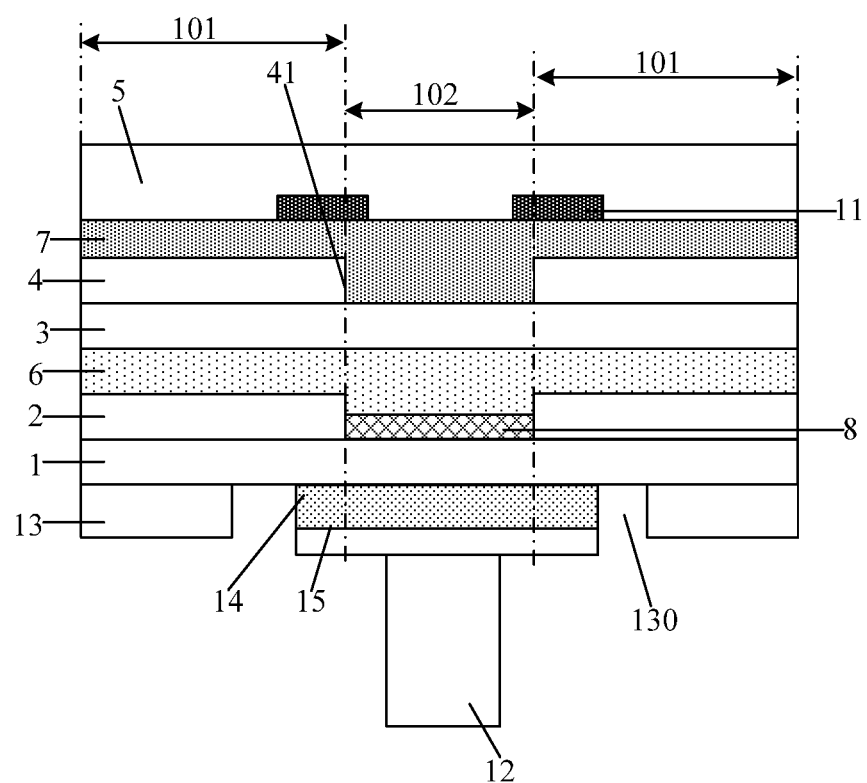
FIG. 7 is a structural sectional view of another display apparatus according to the present disclosure.

In the present disclosure, as shown in FIG. 7, the distance between a side surface of the fixing plate 15 away from the base 1 and the base 1 is larger than the thickness of the heat dissipation layer 13. With such arrangement, compared with the camera installation position shown in FIG. 2, the camera 12 will not be located in the recessed opening, thereby avoiding the light scattered and reflected at the edge of the opening, as well as blurred edges of the images captured by the camera 12, and thus ensuring the shooting effect of the camera 12. Meanwhile, since the camera 12 is not located in the recessed opening, uneven stress will not occur when the camera 12 is installed in the camera installation area 102, thereby avoiding black spots on the display apparatus during display, and ensuring the display effect of the display apparatus.

In the display apparatus provided in the embodiments of the present disclosure, by adopting the display substrate as described above, not only normal shooting of the camera is ensured, but also light leakage in the camera installation area is avoided, thereby ensuring the shooting effect of the camera. Meanwhile, uneven stress will not occur when the camera is installed in the display apparatus, thereby avoiding black spots on the display apparatus during display, and ensuring the display effect of the display apparatus.

The display apparatus provided in the embodiments of the present disclosure may be any product or component with a display function, such as an OLED panel, an OLED television, a monitor, a mobile phone, a navigator, or the like.

It will be appreciated that the above implementations are merely exemplary implementations for the purpose of illustrating the principle of the present disclosure, and the present disclosure is not limited thereto. Various modifications and improvements can be made by a person having ordinary skill in the art without departing from the protection scope of the disclosure defined in the accompany claims, and accordingly, all of these modifications and improvements fall into the protection scope of the present disclosure.

What is claimed is:

1. A display substrate, comprising a base, and an organic electroluminescent display layer, a touch layer, a polarizer and a cover plate sequentially stacked on the base,
    wherein the organic electroluminescent display layer and the touch layer are bonded with a first bonding layer, and the polarizer and the cover plate are bonded with a second bonding layer,
    wherein the display substrate comprises a display area and a camera installation area, the display area surrounds the camera installation area, a camera is configured to be installed on a side of the base away from the organic electroluminescent display layer and located in the camera installation area, and
    wherein a light-emitting layer is at least not provided in an area of the organic electroluminescent display layer corresponding to the camera installation area, and a first opening is provided in an area of the polarizer corresponding to the camera installation area,
    wherein the second bonding layer is filled in the first opening, and a side surface of the second bonding layer away from the polarizer is flat,
    wherein the area of the organic electroluminescent display layer corresponding to the camera installation area is provided with a pixel driving circuit disposed on the base.

2. The display substrate according to claim 1, wherein the first bonding layer is in contact with the pixel driving circuit in the camera installation area, and a side surface of the first bonding layer away from the organic electroluminescent display layer is flat.

3. The display substrate according to claim 1, further comprising an encapsulation layer disposed between the organic electroluminescent display layer and the first bonding layer and configured to encapsulate the organic electroluminescent display layer.

4. The display substrate according to claim 1, wherein the cover plate is provided with a light-shielding layer located on a side of the cover plate closer to the polarizer or away from the polarizer, and an orthographic projection of the light-shielding layer on the base covers an edge of the camera installation area.

5. The display substrate according to claim 1, wherein the base, the touch layer, and the cover plate are all transparent.

6. The display substrate according to claim 1, wherein the first bonding layer and the second bonding layer are both made of a transparent bonding adhesive material.

7. A display device, comprising the display substrate according to claim 1, and further comprising a camera which is disposed on a side of the base away from the organic electroluminescent display layer in the display substrate, and located in the camera installation area.

8. The display apparatus according to claim 7, wherein the first bonding layer is in contact with the pixel driving circuit in the camera installation area, and a side surface of the first bonding layer away from the organic electroluminescent display layer is flat.

9. The display apparatus according to claim 7, further comprising a heat dissipation layer disposed on a side of the base away from the organic electroluminescent display layer in the display substrate, wherein the heat dissipation layer has a second opening provided in an area corresponding to the camera installation area of the display substrate.

10. The display apparatus according to claim 9, further comprising a third bonding layer and a fixing plate,
wherein the third bonding layer is disposed in the second opening, the fixing plate is disposed on a side of the third bonding layer away from the base, and an orthographic projection of the fixing plate on the base is located in the second opening, and
wherein the camera is fixed on the fixing plate and located on a side of the fixing plate away from the display substrate.

11. The display apparatus according to claim 10, wherein a distance between a side surface of the fixing plate away from the base and the base is equal to a thickness of the heat dissipation layer.

12. The display apparatus according to claim 10, wherein a distance between a side surface of the fixing plate away from the base and the base is larger than a thickness of the heat dissipation layer.

* * * * *